United States Patent [19]
Woolf et al.

[11] Patent Number: 5,118,663
[45] Date of Patent: Jun. 2, 1992

[54] FABRICATION OF SILVER COATED HIGH TEMPERATURE CERAMIC SUPERCONDUCTOR FIBER WITH METAL SUBSTRATE

[75] Inventors: Lawrence D. Woolf, Carlsbad; Michael V. Fisher, San Diego; William A. Raggio, Del Mar; Frederick H. Elsner, Carlsbad, all of Calif.

[73] Assignee: General Atomics, San Diego, Calif.

[21] Appl. No.: 586,450

[22] Filed: Sep. 21, 1990

[51] Int. Cl.⁵ ............................................. H01B 12/00
[52] U.S. Cl. ...................................... 505/1; 505/739; 505/813; 505/821; 419/7; 419/20; 419/27; 428/632; 428/633; 428/471
[58] Field of Search ................... 505/1, 739, 813, 821; 419/7, 20, 27; 428/632, 633, 471

[56] References Cited

U.S. PATENT DOCUMENTS

| | | | |
|---|---|---|---|
| 4,937,228 | 6/1990 | Takahashi | 505/1 |
| 4,983,576 | 1/1991 | Hagino et al. | 505/1 |
| 5,041,414 | 8/1991 | Reich | 505/1 |
| 5,047,389 | 9/1991 | Woolf et al. | 505/1 |

Primary Examiner—Stephen J. Lechert, Jr.
Attorney, Agent, or Firm—Nydegger & Associates

[57] ABSTRACT

A method and apparatus for manufacturing a superconductor wire has a wire take-up spool and a feed speed control spool. A wire substrate is taken from the feed speed control spool and onto the take-up spool as the wire take-up spool is rotated. The wire passes through a container which holds a diffusion barrier material, where the diffusion barrier material is electrophoretically deposited onto the wire substrate and subsequently sintered. The wire is also passed through a container which holds a superconductor material suspended in solution, and a layer of the superconductor material is electrophoretically deposited onto the diffusion barrier. The grains of the superconductor layer are then magnetically aligned and sintered. Also, a silver coating is electrophoretically deposited onto the superconductor layer and sintered. A diffusion bonding inhibitor material is then applied to the silver coating. Then, the silver-coated superconductor wire is spooled and heated to four hundred degrees centigrade (400° C.) for (1) day to oxidize the superconductor layer.

28 Claims, 2 Drawing Sheets

FABRICATION OF SILVER COATED HIGH TEMPERATURE CERAMIC SUPERCONDUCTOR FIBER WITH METAL SUBSTRATE

FIELD OF THE INVENTION

The present invention relates generally to methods and apparatus for manufacturing superconductor wire. More particularly, the present invention relates to methods and apparatus for manufacturing ceramic superconductor wires which have a superconducting transition temperature above twenty (20) Kelvins. The present invention particularly, though not exclusively, relates to methods and apparatus for manufacturing and spooling relatively long lengths of high critical temperature ceramic superconductor wires.

BACKGROUND OF THE PRIOR ART

Recent advances in ceramic superconductor technology have made a wide variety of superconductor applications technically possible and economically feasible. This is because, as is well-known, ceramic superconductors have relatively high superconducting transition temperatures ($T_c$), as compared to previously known superconductors, e.g., niobium-based superconductors. As a consequence of the high $T_c$ of modern ceramic superconductors, relatively expensive and difficult to handle coolants such as liquid helium, which had been required to cool previously known superconductors to about four (4) Kelvins in order to achieve superconductivity, are not required to cool modern ceramic superconductors. Instead, modern ceramic superconductors can be cooled to their superconducting state with relatively inexpensive and easy to handle coolants, e.g., liquid nitrogen.

One obvious application of high-$T_c$ superconductors is the transmission of electricity. Not surprisingly, several methods have been developed for forming ceramic superconductors into electrical transmission wires. Unfortunately, ceramic superconductors tend to be brittle and easily broken, while electrical wires must typically be flexible and relatively impervious to breaking under ordinary operating conditions. Accordingly, methods for coating a flexible metallic wire substrate with a ceramic superconductor layer have been disclosed, e.g. the process disclosed in copending U.S. patent application Ser. No. 265,827, entitled "Substrate for a Ceramic Superconductor", assigned to the same assignee as the present invention.

While supporting a ceramic superconductor layer on a substrate can help alleviate the brittleness problem noted above, at least to some extent, where the substrate is a flexible wire other technical complications can arise. For example, material from the wire substrate can diffuse into the ceramic crystal structure and dope the crystal structure. This doping of the ceramic crystal structure can limit the amount of current the superconductor layer can carry in the superconducting state. Accordingly, processes such as the method disclosed in co-pending U.S. patent application Ser. No. 528,707, entitled "Method for Electroplating of Yttrium Metal in Nonaqueous Solutions", have been introduced which disclose methods for forming a diffusion barrier between the substrate and superconductor. Additionally, the ceramic superconductor must be protected from water and other contaminates that could potentially damage the ceramic or destroy the ceramic's superconducting properties. Thus, it is desirable that the superconductor wire be coated with a material which will have minimal chemical interaction with the ceramic material, but which will provide a protective cover with low electrical contact resistance for the ceramic material. A method for coating a ceramic with a protective layer is disclosed in a co-pending U.S. patent application entitled "Anhydrous Electrophoretic Silver Coating Technique", assigned to the same assignee as the present invention. Finally, ancillary steps in the superconductor wire manufacturing process may be desirable. For example, it may be desirable to magnetically align the grains of the superconductor ceramic layer, in order to maximize the current carrying capacity of the wire in its superconductive state. Additionally, it may be desirable to provide a diffusion inhibiting barrier to prevent the protective cover from diffusing into exterior components during heating. Such a barrier is disclosed in a co-pending U.S. patent application entitled "Diffusion Bonding Inhibitor for Silver Coated Superconductor", assigned to the same assignee as the present invention.

In light of the above discussion, it will be appreciated that the manufacture of industrially useful ceramic superconductor wire can involve several steps. In the case of a manufacturing process which is designed to mass produce lengths of superconductor wire, the steps discussed above are preferably accomplished in an integrated, automated sequence, after which the manufactured superconductor wire can be wound onto a spool or other industrially appropriate configuration. The present invention recognizes that a ceramic superconductor wire can be produced by a single apparatus using a continuous, integrated process to fulfill each of the manufacturing considerations noted above.

Accordingly, it is an object of the present invention to provide a method and apparatus for manufacturing a ceramic superconductor wire which produces an effectively flexible superconductor wire. It is another object of the present invention to provide a method and apparatus for manufacturing a ceramic superconductor wire with a protective coating. A further object of the present invention is to provide a method and apparatus for manufacturing a ceramic superconductor wire in which the grains of the ceramic superconductor are substantially aligned. Another object of the present invention is to provide a method and apparatus for manufacturing a ceramic superconductor wire in which a diffusion barrier is established between the wire substrate and the ceramic superconductor layer. Yet another object of the present invention is to provide a method and apparatus for manufacturing a ceramic superconductor wire which produces a superconductor wire in an integrated, continuous process. Finally, it is an object of the present invention to provide a method and apparatus for manufacturing a ceramic superconductor wire which is comparatively cost effective.

SUMMARY

An apparatus and method for manufacturing a ceramic superconductor wire in accordance with the present invention includes a wire take-up spool and a feed speed control spool. A metallic wire substrate, preferably made of Duranickel 301, is attached to both spools. The wire take-up spool is rotatable at a variable speed to draw wire from the feed speed control spool, while the feed speed control spool is also rotatable at a variable speed which is operatively compatible with the speed of the take-up spool. A tension sensor is positioned adjacent the wire between the spools to sense the speed of the supply spool with respect to the take-up spool and generate a control signal in response thereto. The signal from the tension sensor is sent to a microprocessor or other control unit, which controls the speed of rotation of the feed speed control spool to establish the speed of the supply spool. A minimum yet constant (and controllable) tension is provided by the tension sensor.

As the wire substrate is drawn from the feed speed control spool to the wire take-up spool, the wire substrate is passed through a processing zone. As the wire is drawn through this processing zone, it is covered or coated with successive layers of different materials, which combine to form the final product. In radial order from innermost layer to outermost layer, the layers of material for the final product include a diffusion barrier, a superconductor layer, a protective coating, and a diffusion inhibiting layer.

More specifically, the wire is drawn through a container which holds a diffusion barrier material in solution with a solvent. As intended for the present invention, this diffusion barrier material is any suitable material which will substantially prevent diffusion of materials from the wire substrate through the diffusion barrier to the superconductor ceramic layer. In the preferred embodiment, the diffusion barrier material is $NdBa_2Cu_3O_{7-x}$, the solvent is propylene carbonate and the material charging agent is ethanolamine. In order to coat the substrate with the diffusion barrier material, an electrophoresis process is used wherein the substrate is established as an electrode. The other electrode of this process is disposed in the solution, and a voltage is applied to the electrodes to electrophoretically coat the metallic wire substrate with a layer of the diffusion barrier material as the wire substrate passes through the container. As the wire is drawn out of the container, the wire is heated to evaporate solvents in the diffusion barrier and the diameter of the wire is then measured by an optical micrometer to determine the thickness of the diffusion barrier. The micrometer then generates a signal which is representative of the thickness of the diffusion barrier. This signal is sent to a microprocessor, which selectively establishes the voltage applied to the electrode in response to the signal from the micrometer to control the thickness of the diffusion barrier. The wire with diffusion barrier then passes through a furnace at nine hundred degrees centigrade (900° C.) in oxygen in order to sinter the barrier layer material.

The wire substrate with diffusion barrier also passes through a container which holds a ceramic superconductor material in solution. In the preferred embodiment, the superconductor material is $DYBa_2Cu_3O_{7-x}$, and the solvent is propylene carbonate and the material charging agent is ethanolamine. A layer of this superconductor material is deposited onto the diffusion barrier in the same manner in which the diffusion barrier was deposited onto the wire substrate. More particularly, the substrate is again used as an electrode and another electrode is positioned in the superconductor solution. A voltage is then applied between the electrodes to electrophoretically coat a layer of the superconductor material onto the diffusion barrier as the wire substrate passes through the container. As the wire is drawn out of the container, the wire is heated to remove sufficient solvent from the superconductor layer to increase the viscosity of the layer and the diameter of the wire is measured by an optical micrometer to determine the thickness of the superconductor layer. As before, the micrometer generates a signal which is representative of the thickness of the superconductor layer. This signal is sent to a microprocessor, and the microprocessor establishes the voltage applied to the electrode of the superconductor solution in response to the micrometer signal to control the thickness of the superconductor layer.

Importantly, the wire is also drawn past a permanent magnet to magnetically align the crystal grains in the superconductor layer which have been deposited over the diffusion barrier. In accordance with the present invention, the magnetically aligned crystal grains are sintered in an oxygen atmosphere at approximately one thousand fifteen degrees centigrade (1015° C.).

Continuing with the description of the processing of the wire, the wire substrate with superconductor layer is also drawn through a container which holds a nonaqueous alcohol-based silver slurry. Again the substrate is used as an electrode and another electrode is positioned in the silver slurry. When a voltage is established between these electrodes, small particles of silver suspended in the slurry are electrophoretically coated onto the superconductor layer. Consequently, a protective coating of silver is formed over the superconductor layer. An optical micrometer measures the thickness of the silver layer as the wire passes out of the silver slurry, and the voltage of the silver slurry electrode is established by a microprocessor in response to the signal from the optical micrometer. The silver coating is then sintered in an oxygen atmosphere at approximately nine hundred degrees centigrade (900° C.).

Finally, a diffusion inhibiting powder is deposited onto the silver coating by passing the wire through a solution containing ceramic powder. In the preferred embodiment, the ceramic powder is yttria or a rare earth oxide. The coated wire with yttria powder is then wound around the wire take-up spool. To oxidize the superconductor layer, the coils are removed from the coating apparatus and heated in a separate furnace in the range of three hundred fifty to five hundred degrees centigrade (350° C.–500° C.) for approximately one (1) day. During this oxygenation process, the yttria layer prevents the silver coatings of juxtaposed wires from diffusing into each other during the oxidation process.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figures 1, 2, 3:
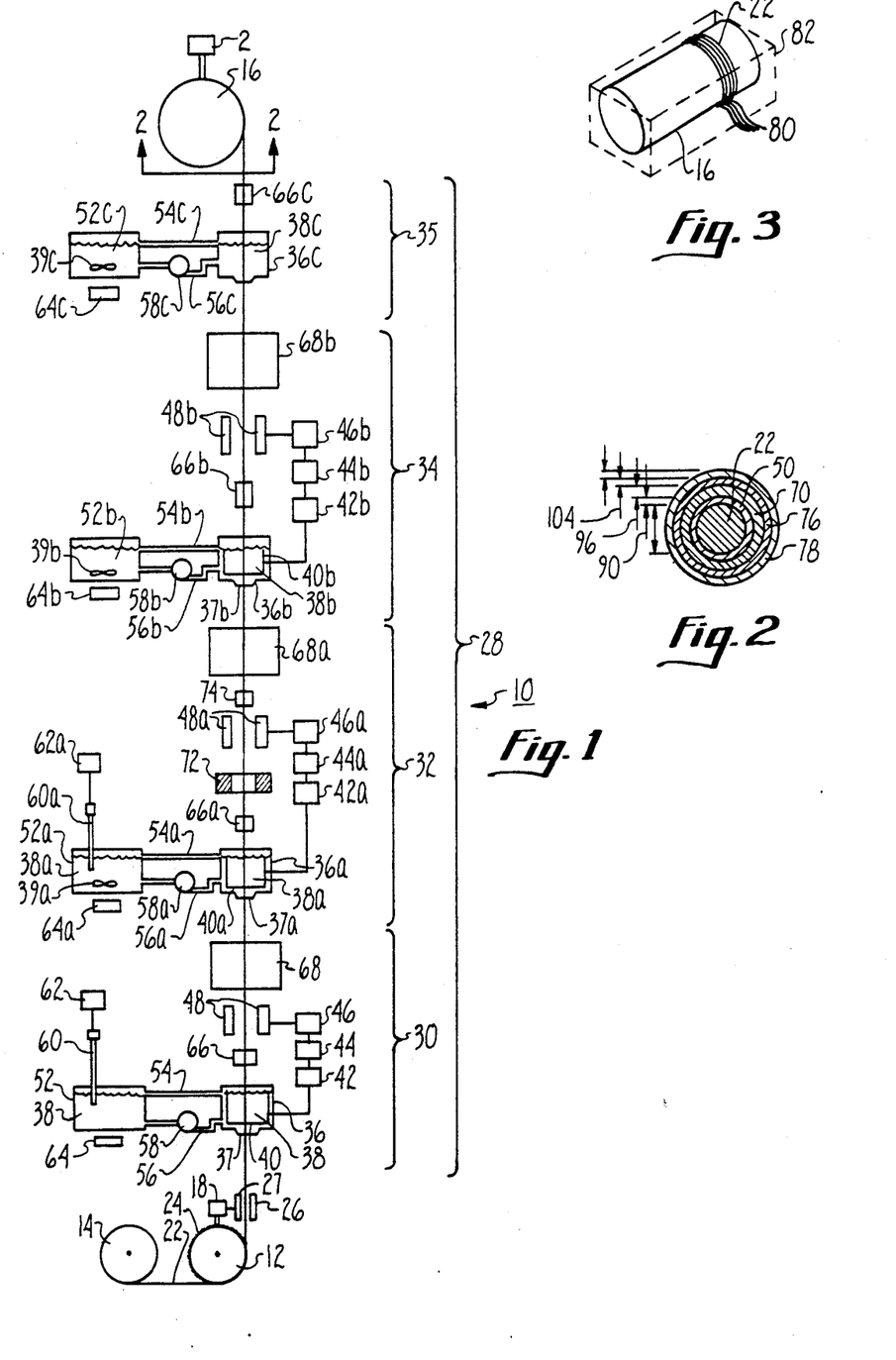
FIG. 1 is a schematic diagram of the apparatus for manufacturing a superconductor wire in accordance with the novel method of the present invention.
FIG. 2 is a cross-sectional view of the superconductor wire manufactured in accordance with the novel method of the present invention, as would be seen along the line 2—2 in FIG. 1.
FIG. 3 is a perspective view of the superconductor wire manufactured in accordance with the novel method of the present invention, showing the wire in a spooled configuration, with portions shown in phantom for clarity.

Referring initially to FIG. 1, an apparatus generally designated 10 is shown for manufacturing superconductor wire. As shown in FIG. 1, apparatus 10 includes a rotatable feed speed control spool 12, a rotatable wire supply spool 14, and a rotatable wire take-up spool 16. Spools 12 and 16 can be rotated at preselected speeds of rotation by respective dc motors 18, 20, while supply spool 14 is effectively freely rotatable on apparatus 10. A metallic wire substrate 22 is attached to wire supply spool 14 and passes partially around feed speed control spool 12, as shown. Wire substrate 22 is also attached to wire take-up spool 16.

To transfer wire 22 from wire supply spool 14 to take-up spool 16, motor 20 is energized to rotate wire take-up spool 16. Importantly, a frictional rubber or plastic layer 24 is deposited onto the outer circumference of feed speed control spool 12. Consequently, wire substrate 22 cannot slide freely over the frictional layer 24 when take-up spool 16 is rotated. Instead, to transfer wire past feed speed control spool 12, feed speed control spool 12 must be appropriately rotated to feed wire substrate 22 at a speed that is compatible with the speed at which take-up spool 16 is able to receive the substrate 22. The actual tension in wire substrate 22 as it passes from feed speed control spool 12 to take-up spool 16 is established by a tension sensor 26.

FIG. 1 further shows that a tension sensor 26 is positioned adjacent wire substrate 22 for sensing the speed of the feed spool with respect to the take-up spool and for generating a signal representative of the differences of speed. Tension sensor 26 is preferably a rotatable member which engages with substrate 22 and which moves in response to changes in tension on the substrate 22. Tension sensor 26 also includes appropriate electronic signal processing components (not shown) which translate movement of the rotatable arm into an output signal. As shown in schematic in FIG. 1, the output signal from sensor 26 is electrically conducted to a microprocessor 27, which generates a control signal in response to the speed of the feed spool. This control signal is sent to motor 18 to control the speed of rotation of feed speed control spool 12 (and, hence, to match the speed of the feed spool with the speed of the take-up spool), establish a predetermined tension for wire substrate 22). The details of the construction and operation of tension sensor 26, microprocessor 27, and feed speed control spool 12 are disclosed in co-pending U.S. patent application entitled "Wire Tension Control Apparatus", which is assigned to the same assignee as the present invention.

Proceeding with the description of apparatus 10, FIG. 1 shows that wire substrate 22 is drawn through a processing zone 28. In accordance with the present invention, wire substrate 22 is continuously drawn through zone 28 while wire substrate 22 is being wound around take-up spool 16. Processing zone 28 includes a diffusion barrier deposition region 30, a superconductor deposition region 32, a protective coating deposition region 34, and a diffusion inhibitor deposition region 35. Diffusion inhibitor deposition region 35 may not be required, depending on the requirements for the final product and on the desired reliability of the coating system. Diffusion barrier deposition region 30 includes a container 36 which holds a solution 38 of diffusion barrier material. Container 36 can be formed with a water tight diaphragm 37 through which wire substrate 22 can be drawn. The diffusion barrier material suspended in solution 38 is any appropriate substance which can substantially prevent the diffusion of material from substrate 22 to superconductor layer 70, shown in FIG. 2, and which is chemically compatible with substrate 22 and the superconductor material to be subsequently deposited onto substrate 22. In the preferred embodiment, solution 38 is a mixture of $NdBa_2Cu_3O_{7-x}$ particles with grain size of one-tenth to ten (0.1-10) microns, (i.e., Neodymium-based 1-2-3 superconductor) where x is from zero to one-half (0-0.5), inclusive, the solvent is anhydrous propylene carbonate, and the particle charging agent is ethanolamine.

FIG. 1 shows that an annular electrode 40 is disposed in container 36 coaxially with container 36 to surround substrate 22. Electrode 40 is electrically connected to a voltage source 42, which is in turn electrically connected to a microprocessor 44. Microprocessor 44 selectively causes voltage source 42 to establish a predetermined voltage on electrode 40, to electrophoretically deposit a layer of the diffusion barrier material that is contained in solution 38 onto wire substrate 22. As shown in FIG. 1, microprocessor 44 is electrically connected to a micrometer controller 46, which receives the output signal of a non-contact optical micrometer 48. Optical micrometer 48 is any suitable light emitting diode (LED) device or laser device well-known in the pertinent art which can measure the diameter of coated wire substrate 22 and generate an output signal that is representative of the thickness of diffusion barrier 50. This output signal is transmitted through micrometer controller 46 to microprocessor 44. Based upon the signal from micrometer controller 46, microprocessor 44 controls voltage source 42 to establish the predetermined voltage on electrode 40, as described above. As is well-known in the art, the voltage present on electrode 40 establishes the thickness 90 of the diffusion barrier 50, shown in FIG. 2.

Referring back to FIG. 1, diffusion barrier deposition region 30 of processing zone 28 is shown to further include a supply vat 52, which contains a portion of solution 38. Diffusion barrier material can be added to the portion of solution 38 which is held in vat 52 as required to maintain a predetermined concentration of the diffusion barrier material in solution 38. Importantly, solution 38 can be circulated through lines 54, 56 from vat 52 to container 36 by a pump 58. Consequently, the solution 38 that is held in container 36 can be replenished from vat 52.

To prevent the agglomeration of particulate material within vat 52, an ultrasonic transducer 60 is positioned in vat 52 to ultrasonically agitate solution 38. A suitable transducer power supply 62 is electrically connected to transducer 60 to energize transducer 60. Also, a magnetic stirrer 64 is positioned next to vat 52 to magnetically agitate solution 38 using magnetic stir bar 39, to prevent sedimentation of the particles in solution 38.

FIG. 1 also shows that wire substrate 22 with diffusion barrier 50 is passed through an oven 66 that contains an inert atmosphere, preferably argon or nitrogen gas, in which diffusion barrier 50 can be heated to about two hundred degrees centigrade (200° C.) in order to evaporate the solvent portion of solution 38 that has been electrophoretically coated onto substrate 22, leaving only the barrier layer 50 particles attached to substrate 22. This facilitates the measurement of the thickness 90 of diffusion barrier 50 as described above.

As further shown in FIG. 1, wire substrate 22 with diffusion barrier 50 is drawn through a furnace 68. Furnace 68 heats diffusion barrier 50 to approximately nine hundred degrees centigrade (900° C.) in an oxygen atmosphere for approximately one-tenth to two minutes (0.1-2 min.), to sinter diffusion barrier 50, shown in FIG. 2. The barrier 50 needs to be sintered at a sufficiently high temperature so that it will not separate from substrate 22 when passing through subsequent inlet diaphragm 37a, but not too high so as to minimize diffusion of substrate 22 components into the diffusion barrier 50 grains or particles.

Still referring to FIG. 1, superconductor deposition region 32 is shown to include a container 36a which is formed with a leak-tight diaphragm 37a. Container 36a is in all essential respects identical in function and configuration to container 36. Container 36a holds a suitable non-aqueous solvent in a solution 38a. A superconductor material having the formula $REBa_2Cu_3O_{7-x}$, where RE is selected from the group consisting of yttrium and elements having atomic numbers between fifty-seven (57) and seventy-one (71), inclusive, and combinations thereof, and x is from zero to one-half (0-0.5), inclusive, is dissolved in solution 36a. In the preferred embodiment, the superconductor material is $DyBa_2Cu_3O$ of particle size one-half to two (0.5-2) microns, the solvent is anhydrous propylene carbonate and the material charging agent is ethanolamine. FIG. 1 also shows that container 36a is connected in fluid communication through lines 54a, 56a to a vat 52a. Pump 58a can circulate solution 38a from vat 52a to container 36a. FIG. 1 also shows that an ultrasonic transducer 60a is positioned in vat 52a to ultrasonically agitate solution 38a. A power supply 62a is electrically connected to transducer 60a to energize transducer 60a. Also, a magnetic stirrer 64a is positioned next to vat 52a to mechanically agitate the solution 38a using magnetic stir bar 39a held within vat 52a.

An annular electrode 40a, similar in configuration and function to electrode 40, is disposed in container 36a coaxially with container 36a. A voltage source 42a is electrically connected to electrode 40a to establish a voltage on electrode 40a relative to wire substrate 22. Consequently, as wire substrate 22 with barrier 50 is drawn through container 36a, the superconductor material suspended in solution 38a is electrophoretically deposited onto diffusion barrier 50 to form a superconductor layer 70, shown in FIG. 2.

Voltage source 42a is electrically connected to a microprocessor 44a, which is in turn electrically connected to a micrometer controller 46a. Micrometer controller 46a is electrically connected to an optical micrometer 48a, which sends a signal to micrometer controller 46a that is representative of the thickness 96 of superconductor layer 70, shown in FIG. 2. As was the case for micrometer 48, micrometer 48a is any suitable non-contact optical micrometer. Micrometer controller 46a sends the signal from micrometer 48a to microprocessor 44a, which selectively controls voltage source 42a to establish the voltage present on electrode 40a (and, hence, the thickness 96 of superconductor layer 70, shown in FIG. 2).

FIG. 1 also shows that wire substrate 22 is passed through an oven 66a. Oven 66a heats superconductor layer 70 to approximately one hundred degrees centigrade (100° C.) in an inert gas atmosphere (e.g., argon) to evaporate solvent from superconductor layer 70. Importantly, after passing through oven 66a, some excess solvent remains on superconductor layer 70 to establish a viscosity of superconductor layer 70 which is appropriate for facilitating the magnetic alignment of the superconductor grains which compose layer 70.

More particularly, as shown in FIG. 1, wire substrate 22 with superconductor layer 70 is drawn through permanent magnet 72. Magnet 72 generates a magnetic field of approximately 1.5 tesla at the wire position 73. This magnetic field at position 73 has a direction which is appropriate for aligning the grains of superconductor layer 70 for optimum current carrying capacity, in accordance with well-known principles. As is well known in the art, superconductor layer 70 can carry more current in the superconductive state when the crystal grains of the superconductor are magnetically aligned, as compared to a superconductor having unaligned grains.

Continuing with the description of the apparatus 10 for manufacturing superconductor wire in accordance with the present invention, superconductor layer 70 is heated to approximately three hundred fifty degrees centigrade (350° C.) in an oven 74 to completely bake off excess solvent from superconductor layer 70. Layer 70 is heated to 350° C. in oven 74 in an inert atmosphere, preferably argon, in order to evaporate substantially all remaining solvent from layer 70. As the skilled artisan will appreciate, it is necessary to evaporate excess solvent from layer 70 because any remaining solvent would react with the oxygen in furnace 68a to form $CO_2$ which would deleteriously affect the subsequent superconducting properties of superconductor layer 70. Further, as shown in FIG. 1, wire substrate 22 with layer 70 is drawn through furnace 68a to sinter superconductor layer 70. More specifically, superconductor layer 70 is heated to approximately one thousand fifteen degrees centigrade (1015° C.) for two to ten (2-10) minutes in an oxygen atmosphere inside furnace 68a to sinter superconductor layer 70.

FIG. 1 also shows that wire substrate 22 with layer 70 is drawn through silver coating deposition region 34. More specifically, deposition region 34 is shown to include a container 36b which is formed with a leak-tight diaphragm 37b. Container 36b is in all essential respects identical in function and configuration to container 36. Container 36b holds a suitable non-aqueous solvent in a solution 38b. The solvent in solution 38b is preferably non-aqueous in order to avoid adversely affecting the superconducting properties of ceramic superconductor layer 70, which, as is well known in the art, can be damaged by contact with water. A silver coating will substantially prevent the diffusion of water, carbon dioxide, and other undesired impurities into temperature diffusion of oxygen through the silver to superconductor layer 70, and will form a low electrical resistance contact to the superconductor. In the preferred embodiment, solution 38b includes silver particles of the type known in the art as Metz Metallurgical silver powder type SED, of nominal particle size of one-half to one and one-half (0.5-1.5) microns, and the solvent is alcohol, preferably non-aqueous octanol. To establish a means for the silver particles to carry a charge, a surfactant such as oleic acid is deposited onto the silver particles before the silver particles are placed in solution 38b; the type SED powder is already of this form.

FIG. 1 also shows that container 36b is connected in fluid communication through lines 54b, 56b to a vat 52b. Pump 58b can circulate solution 38b from vat 52b to container 36b. Additionally, FIG. 1 shows that a rotatable magnetic stirrer 64b is positioned next to vat 52b to agitate the solution 38b using magnetic stir bar 39b held within vat 52b.

FIG. 1 further shows that an annular electrode 40b, which is similar in function and configuration to electrode 40, is disposed in container 36b concentrically with container 36b. A voltage source 42b is electrically connected to electrode 40b to establish a voltage on electrode 40b relative to wire substrate 22. Consequently, as wire substrate 22 is drawn through container 36b, the silver particles suspended in solution 38b are electrophoretically deposited onto superconductor layer 70 to form an electrically conductive protective coating 76, shown in FIG. 2.

FIG. 1 further shows that voltage source 42b is electrically connected to a microprocessor 44b, which is in turn electrically connected to a micrometer controller 46b. Micrometer controller 46b is electrically connected to an optical micrometer 48b, which is a laser or other suitable non-contact micrometer. Micrometer 48b sends a signal that is representative of the thickness 104 of protective layer 76, shown in FIG. 2, to micrometer controller 46b. Micrometer controller 46b in turn sends the signal from micrometer 48b to microprocessor 44b, which selectively controls voltage source 42b to establish the voltage present on electrode 40b (and, hence, the thickness 104 of protective coating 76, shown in FIG. 2).

FIG. 1 also shows that wire substrate 22 is passed through an oven 66b. Oven 66b heats protective coating 76 to approximately two hundred degrees centigrade (200° C.) in an inert gas atmosphere to evaporate excess solvent from protective coating 76, to facilitate measuring the thickness of protective coating 76 by optical micrometer 48b, as described above. FIG. 1 further shows that wire 22 is drawn through a furnace 68b, where protective coating 76 is sintered at approximately nine hundred degrees centigrade (900° C.) for approximately one-half to two (0.5-2) minutes in an oxygen atmosphere.

Continuing with the description of apparatus 10, FIG. 1 shows that wire substrate 22 with silver coating 76 is drawn through a container 36c. Container 36c holds a non-aqueous solution 38c of a ceramic powder (e.g., yttrium or rare earth oxide powder) in a fluid medium such as isopropanol. As wire 22 is drawn through container 36c, portions of the solution 38c adhere to silver coating 76 to form diffusion inhibiting layer 78. FIG. 1 also shows that container 36c is connected in fluid communication through lines 54c, 56c to a vat 52c. A pump 58c can circulate solution 38c from vat 52c to container 36c. Further, FIG. 1 shows that a magnetic stirrer 64c is positioned next to vat 52c to magnetically agitate the solution 38c held within vat 52c using a magnetic stir bar 39c. If the liquid portion of solution 38c can evaporate at room temperature, then only the ceramic powder will remain as residue which forms a diffusion inhibiting layer 78 on the silver coating layer 76. If the liquid portion of solution 38 does not completely evaporate at room temperature, then the remaining solution residue will evaporate or combust during the subsequent heat processing steps disclosed below, leaving only the ceramic powder residue on silver coating layer 76.

It is important that the diffusion inhibiting layer 78 will be non-reactive with silver coating 76 during subsequent processing steps. Specifically, it is important that layer 78 be non-reactive with silver at the temperatures and during the time when the superconductor layer 70 is being oxygenated. It has been determined that a layer 78 of yttrium oxide ($Y_3O_2$) ceramic powder is effective for this purpose. Further, a stainless steel powder or an aluminum powder could be effective.

Finally, FIG. 1 shows that wire substrate 22 is spooled onto wire take-up spool 16. More particularly, as shown in FIG. 3, wire substrate 22 is spooled onto take-up spool 16 in a plurality of juxtaposed coils 80. Portions of each coil 80 may overlap and touch portions of adjacent coils 80, as is common with spooled wires.

As shown in FIG. 3, after take-up spool 16 has received all of wire substrate 27 which is to be processed, the spool 16 can be positioned in a furnace 82 to oxidize superconductor layer 70. More specifically, superconductor layer 70 is heated to three hundred fifty to five hundred degrees centigrade (350° C.–500° C.) in an oxygen atmosphere in furnace 82 for one (1) hour to one (1) week, but preferably for approximately one (1) day, to establish a predetermined oxygen content in superconductor layer 70. Importantly, the respective protective coating 76 of each coil 80 does not diffuse into juxtaposed coils 80 because such diffusion is substantially prevented by respective diffusion inhibiting layers 78. In addition, a metal spongy mesh material is positioned between the spooled coils 80 and take-up spool 60 to accommodate thermal expansion mismatch between spool 60 and coils 80 during oxygenation.

Referring back to FIG. 2, it is to be understood that wire substrate 22 is made of a metallic substance, preferably Duranickel 301 or any of the materials listed in the table below:

TABLE 1

| COMPOSITION OF WIRE SUBSTRATES (WEIGHT %) | | | | | | | | | |
|---|---|---|---|---|---|---|---|---|---|
| | Ni | Fe | Cr | Al | Si | Mn | Mg | Ti | Zr | B |
| Duranickel 301 | 94.2 | | | 4.4 | 0.4 | 0.3 | | 0.4 | | |
| Hoskins-875 | | | 71.5 | 22.5 | 5.5 | 0.5 | | | | |
| Alumel | 94.8 | | | 1.5 | 1.5 | 1.7 | | | | |
| Inconel-601 | 60 | 13 | 23 | 1.5 | 0.5 | 1.0 | | | | |
| Haynes-214 | 76.5 | 3 | 16 | 4.5 | | | | | | |
| Nisil | 95.5 | | | | 4.4 | | 0.1 | | | |
| Nicrosil | 84.4 | | 14.2 | | 1.4 | | | | | |
| Ni₃Al | 88.1 | | | 11.3 | | | | | .6 | .02 |

Alternatively, the following alloys may be used: Specifically, these alloys include $Ni_{1-x}Al_x$ ($x \leq 0.25$); $Ni_xAl_yB_z$ ($0.6 \leq x$, $0.1 \leq y \leq 0.25$, and $z \leq 0.1$); and $Ni_xAl_yCu_z$ ($0.6 \leq x$, $y \leq 0.25$, and $z \leq 0.25$).

As disclosed above, diffusion barrier 50 is made of neodymium "1-2-3" superconductor material. The neodymium 1-2-3 superconductor is preferred for this purpose because it has a higher melting point than the dysprosium 1-2-3 superconductor material which is used in the 1-2-3 superconductor layer 70. Consequently, diffusion barrier 50 will not exhibit significant material diffusion/sintering when the superconductor layer 70 is sintered, resulting in minimal diffusion of substrate material into superconductor layer 70. Finally, silver is the preferred material for protective coating 76, because silver establishes a water-impermeable protective coating for superconductor layer 70, while permitting the diffusion of oxygen through coating 76 to facilitate oxidation of superconductor layer 70. Silver is also electrically conductive and makes a low electrical contact resistance joint to superconductor layer 70 when sintered at nine hundred degrees centigrade (900° C.). Consequently, silver coating 76 can provide an electrical interconnection between superconductor layer 70 and loads to which electricity is to be delivered.

METHOD OF MANUFACTURE

Figure 4:
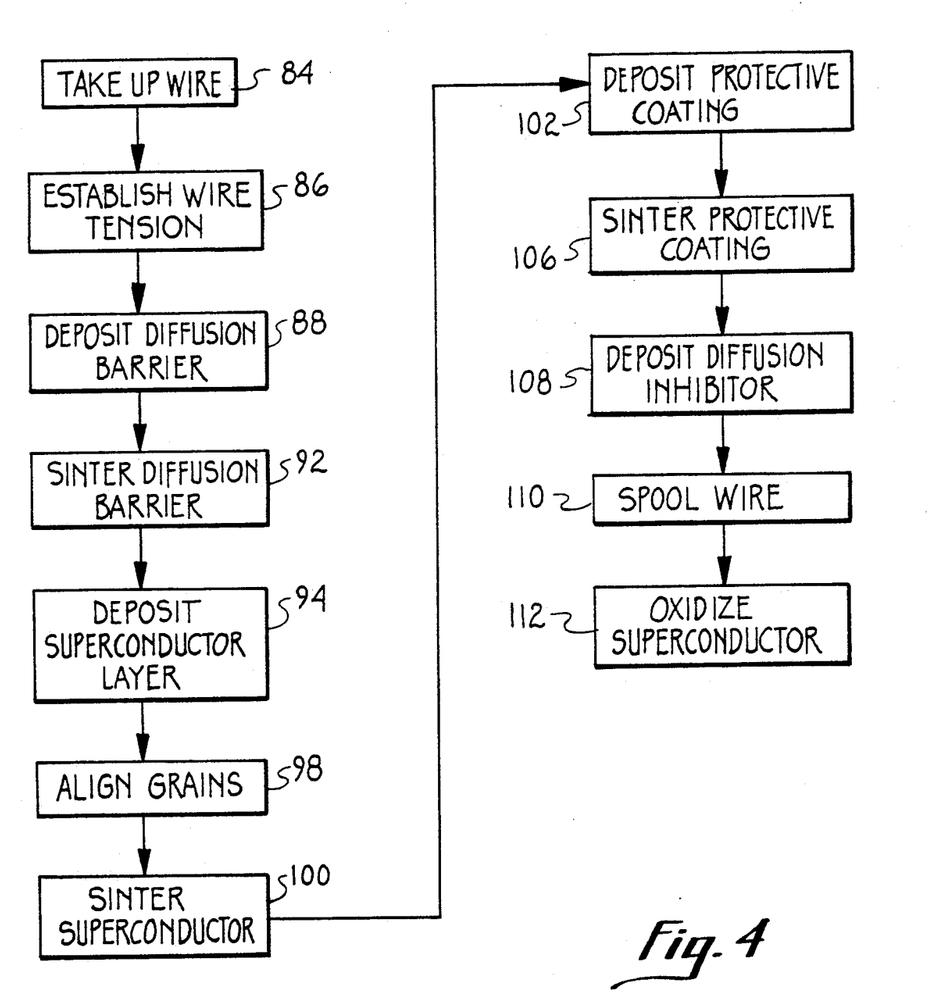
FIG. 4 is a block diagram showing the steps of the novel method of the present invention.

In the method of manufacturing a superconductor wire in accordance with the present invention reference is made to FIGS. 1 and 4. While the disclosure below sequentially describes the steps in which the various barriers, layers, and coatings are deposited onto substrate 22, it is to be understood that substrate 22 is continuously drawn through processing zone 28 and that the steps below are consequently performed simultaneously, but on different portions, of substrate 22.

Wire substrate 22 is initially attached to wire supply spool 14 and wire take-up spool 16. As shown in FIG. 1, substrate 12 is also positioned against feed speed control spool 12. As indicated at block 84 in FIG. 4, wire take-up spool 16 is rotated at a predetermined speed to take up wire substrate 22 from wire supply spool 14. As wire substrate 22 is consequently transferred from supply spool 14 to take-up spool 16, a predetermined tension of wire substrate 22 is established, as indicated at block 86. More specifically, in accordance with previous disclosure, the speed of rotation of motor 18 (and, hence, feed speed control spool 12) is controlled by microprocessor 27 in response to the signal generated by tension sensor 26 to establish the speed of the feed spool 14.

As wire substrate 22 is transferred from supply spool 14 to take-up spool 16, wire substrate 22 passes through processing zone 28. As indicated at block 88 in FIG. 4, diffusion barrier 50 is electrophoretically deposited onto substrate 22 as substrate 22 is drawn through container 36. More specifically, a voltage is supplied from voltage source 42 to electrode 40 to cause the $NdBa_2Cu_3O_{7-x}$ particles that are suspended in solution 38 to be electrophoretically deposited onto substrate 22. Microprocessor 44 controls voltage source 42 to control the voltage present on electrode 40, and to thereby establish the thickness 90 of diffusion barrier 50. As disclosed above, microprocessor 44 controls voltage source 42 in response to the signal from optical micrometer 48, which signal is representative of the thickness 90 of diffusion barrier 50. As shown in FIG. 1 and indicated at block 92 of FIG. 4, diffusion barrier 50 is sintered in furnace 68 at approximately nine hundred degrees centigrade (900° C.) for approximately one-half to two (0.5-2) minutes.

In accordance with previous disclosure, substrate 22 with barrier 50 is also drawn through container 36a. As indicated at block 94 in FIG. 4, superconductor layer 70 is electrophoretically deposited onto barrier 50 when substrate 22 with barrier 50 is drawn through container 36a. More particularly, in accordance with previous disclosure, voltage source 42a provides a voltage for electrode 40a, which causes the $DyBa_2Cu_3O_{7-x}$ particles that are suspended in solution 38a to be electrophoretically deposited onto diffusion barrier 50. In response to the signal from optical micrometer 48a, which is representative of the thickness 96 of superconductor layer 70, microprocessor 44a controls voltage source 42a to control the voltage present on electrode 40a, and to thereby establish the thickness 96 of superconductor layer 70.

Continuing with the description of the method of manufacture, the individual grains of superconductor layer 70 are magnetically aligned as substrate 22 with superconductor layer 70 is drawn past magnet 72, as indicated at block 98 of FIG. 4. The aligned superconductor grains of layer 70 are degrees centigrade (1015° C.) for approximately two to ten (2-10) minutes, as indicated at block 100.

To coat superconductor layer 70 with a silver coating, substrate 22 with superconductor layer 70 is drawn through container 36b. As indicated at block 102 in FIG. 4, silver coating 76 is electrophoretically deposited over superconductor layer 70 as substrate 22 is drawn through container 36b. More particularly, voltage source 42b establishes a voltage on electrode 40b to cause the surfactant-coated silver particles which are suspended in solution 38b to be deposited onto superconductor layer 70. In response to the signal from optical micrometer 48b, which is representative of the thickness 104 of silver coating 76, microprocessor 44b controls voltage source 42b. In turn, voltage source 42b establishes the voltage present on electrode 40b, and thereby establishes the thickness 104 of silver coating 76. As indicated at block 106, silver coating 76 is sintered in furnace 68b at approximately nine hundred degrees centigrade (900° C.) for approximately one-half to two (0.5-2) minutes.

Block 108 indicates that a diffusion inhibiting layer 78 is deposited over silver coating 76 as substrate 22 is drawn through container 36c. More specifically, container 36c holds a non-aqueous solution 38c in which a ceramic powder such as yttria powder is dissolved. The yttria powder adheres to silver layer 76 to form diffusion inhibitor layer 78 as substrate 22 is drawn through solution 38c. Finally, some or all of the volatile parts of solution 38c is evaporated from diffusion inhibitor layer 78 and wire 22 is spooled onto wire take-up spool 16, as indicated at block 110. As indicated at block 112 and shown in FIG. 3, spool 16 and substrate 22 can be heated in furnace 82 to a temperature of about four hundred degrees centigrade (400° C.) for a period of between one (1) hour and one (1) week, and preferably for one (1) day, to optimize the concentration of oxygen in superconductor layer 70.

It will be appreciated by the skilled artisan that operation of the apparatus of the present invention requires precise control over several variables. Furthermore, the control of these variables will be dependent on parameters of the system which are established to be constant. With this in mind, the constant parameter of most importance is the speed at which the wire substrate 22 is to be drawn from supply spool 14 to take-up spool 16. Accordingly, given that the wire substrate 22 is to be drawn from supply spool 14 to the take-up spool 16 through the processing zone 28 at an effectively constant speed, the time periods during which any specific portion of the wire substrate 22 is subject to a particular coating process or a particular heating process in the processing zone 28 will be determined by the physical dimension of the coating device or the heating device. This fact is most important with regard to the heating devices. Specifically, and by way of example, it is preferred that the oven 66 heat wire substrate 22 for approximately one-tenth to two minutes. Thus, depending on the speed at which the wire substrate 22 is drawn onto take-up spool 16, and the exact time duration desired for the heating process to be accomplished by oven 66, the dimensions of the heating zone created by oven 66 can be determined. This same rationale, of course, applies equally to all of the furnaces 66, 66a, 66b, 68, 68a, 68b and 74.

On the other hand, the coating devices are not as constrained by dimensional limitations as are the heating devices. This is so due to the fact that the thickness of the coatings deposited on the wire substrate 22 at any particular stage in the fabrication process will, for the most part, be determined by the voltage level applied during the electrophoresis process and by the concentration of powder particles in the slurries. Consequently, by establishing dimensions for the furnaces 66, 66a, 66b, 68, 68a, 68b and 74 which are compatible with the speed at which wire substrate 22 is drawn through processing zone 28, and by varying the voltages applied by the respective voltage sources 42, 42a and 42b as well as slurry concentrations, the entire process of fabricating a superconductor wire can be accomplished during the transfer of a wire substrate 22 from a supply spool 14 to a take-up spool 16.

While the particular process and apparatus for fabrication of silver coated high temperature ceramic superconductor fiber with metal substrate as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

We claim:

1. A method for manufacturing a high critical temperature superconductor wire, which comprises the steps of:

extending a metallic wire substrate between a rotatable supply spool and a rotatable take-up spool;

drawing said wire substrate from said supply spool to said take-up spool through a processing zone with a predetermined tension on said wire substrate;

fabricating said superconductor wire in said processing zone by forming a ceramic superconductor layer on said metallic wire substrate, said superconductor layer having a substantially uniform thickness; forming a silver coating on said ceramic superconductor layer; and depositing a ceramic powder on said silver coating; and rotating said take-up spool to wind said wire around said take-up spool to form a coil of said wire.

2. A method as recited in claim 1 wherein said take-up spool is continuously rotated to draw said wire around said take-up spool.

3. A method as recited in claim 2 further comprising the step of forming a diffusion barrier directly onto said metallic wire substrate prior to forming said superconductor layer.

4. A method as recited in claim 3 wherein said diffusion barrier is $NdBa_2Cu_3O_{7-x}$, wherein $O \leqq x \leqq 0.5$.

5. A method as recited in claim 1 wherein said superconductor layer is $REBa_2Cu_3O_{7-x}$, (wherein $O \leqq x \leqq 0.5$) and RE is an element selected from the group consisting of yttrium and elements having an atomic number between fifty-seven (57) and seventy-one (71), inclusive, and combinations thereof.

6. A method as recited in claim 1 wherein said superconductor layer forming step is accomplished by continuously drawing said wire through a solution containing said superconductor, said solution having an electrode disposed therein, said electrode having a predetermined voltage established thereon with respect to said metallic substrate, said superconductor layer being eletrophoretically deposited onto said metallic wire substrate as said substrate is drawn through said solution, said superconductor layer being subsequently sintered.

7. A method as recited in claim 6 further comprising the steps of determining the thickness of said superconductor layer, generating a signal indicative of said thickness, and selectively varying said predetermined voltage in response to said signal to vary the thickness of said superconductor layer.

8. A method as recited in claim 1 wherein said silver coating step is accomplished by continuously drawing said wire through a solution containing said silver, said solution having an electrode disposed therein, said electrode having a predetermined voltage established thereon with respect to said metallic substrate, and said silver coating being eletrophoretically deposited onto said superconductor layer as said wire is drawn through said solution, said silver coating being subsequently sintered.

9. A method as recited in claim 8 further comprising the step of determining the thickness of said silver coating, generating a signal indicative of said thickness, and selectively varying said predetermined voltage in response to said signal to maintain the thickness of said silver coating at a predetermined value.

10. A method as recited in claim 6 wherein said superconductor layer is deposited onto said metallic wire substrate in grains, and said method further comprises the step of magnetically aligning said grains prior to said sintering step.

11. A method as recited in claim 1 wherein said ceramic powder is yttrium oxide.

12. A method as recited in claim 1 wherein said take-up spool containing said coil of said wire is heated in an oxygen containing atmosphere for approximately one (1) day at approximately four hundred (400° C.).

13. A method for manufacturing a copper and oxygen containing superconductor wire, which comprises the steps of:

continuously drawing a metallic wire substrate through a processing zone at a predetermined tension;

positioning a first solution in said zone around said wire substrate, said first solution containing ceramic superconductor particles, said first solution having a first electrode disposed therein;

selectively establishing a voltage on said first electrode with respect to said metallic wire substrate to electrophoretically deposit said superconductor particles onto said wire substrate;

sintering said superconductor particles;

positioning a second solution in said zone around said superconductor grains, said second solution containing silver particles, said second solution having a second electrode disposed therein;

selectively establishing a voltage on said second electrode with respect to said metallic wire substrate to electrophoretically deposit said silver particles onto said superconductor grains to form a silver coating thereon;

sintering said silver; and covering said silver coating with a diffusion inhibiting layer.

14. A method as recited in claim 13 further comprising the step of attaching said metallic wire substrate to a rotatable spool and rotating said spool to accomplish said drawing step.

15. A method as recited in claim 14 wherein said superconductor wire is drawn around said spool in a plurality of juxtaposed coils.

16. A method as recited in claim 15 further comprising the step of heating said coils at a predetermined temperature for a predetermined time to establish a predetermined oxygen content in said superconductor layer.

17. A method as recited in claim 13 further comprising the steps of depositing a diffusion barrier onto said metallic wire substrate and sintering said diffusion barrier prior to positioning said first solution around said wire substrate.

18. A method as recited in claim 17 wherein said diffusion barrier is $NdBa_2Cu_3O_{7-x}$, (wherein $O \leqq x \leqq 0.5$).

19. A method as recited in claim 13 wherein said superconductor layer is $REBa_2Cu_3O_{7-x}$, (wherein $O \leqq x \leqq 0.5$), and RE is an element selected from the group consisting of yttrium and elements having an atomic number between fifty-seven (57) and seventy-one (71), inclusive, and combinations thereof.

20. A method as recited in claim 13 further comprising the step of determining the thickness of said superconductor layer, generating a signal indicative of said thickness, and selectively varying said voltage on said first electrode in response to said signal to maintain the thickness of said superconductor layer at a predetermined value.

21. A method as recited in claim 13 further comprising the step of determining the thickness of said silver coating, generating a signal indicative of said thickness, and selectively varying said voltage on said first electrode in response to said signal to maintain the thickness of said silver at a predetermined value.

22. A method as recited in claim 13 further comprising the step of magnetically aligning said superconductor particles.

23. A method as recited in claim 13 wherein said diffusion inhibiting layer is yttrium oxide.

24. A ceramic superconductor wire formed by the process comprising the steps of:
continuously drawing a wire substrate through a processing zone at a predetermined tension;
positioning a first solution in said zone around said wire substrate, said first solution containing ceramic superconductor particles, said first solution having a first electrode disposed therein;
selectively establishing a voltage on said first electrode with respect to said wire substrate to electrophoretically deposit said superconductor particles onto said wire substrate;
sintering said superconductor particles;
positioning a second solution in said zone around said superconductor particles, said second solution containing silver particles, said second solution having a second electrode disposed therein;
selectively establishing a voltage on said second electrode with respect to said wire substrate to electrophoretically deposit said silver particles onto said sintered superconductor particles to form a silver coating thereon;
sintering said silver; and
covering said silver coating with a diffusion inhibiting layer.

25. The superconductor wire of claim 24, wherein said superconductor particles are substantially magnetically aligned.

26. The superconductor wire of claim 25, further comprising a diffusion barrier positioned between said wire substrate and said superconductor layer.

27. The superconductor wire of claim 26, wherein said diffusion barrier is $NdBa_2Cu_3O_{7-x}$, (wherein $O \leqq x \leqq 0.5$).

28. The superconductor wire of claim 24, wherein said superconductor layer is $REBa_2Cu_3O_{7-x}$, (wherein $O \leqq x \leqq 0.5$) and RE is an element selected from the group consisting of yttrium and elements having an atomic number between fifty-seven (57) and seventy-one (71), inclusive, and combinations thereof.

* * * * *